(12) United States Patent
 Oshima (10) Patent No.: US 7,755,447 B2
(45) Date of Patent: Jul. 13, 2010

(54) MULTILAYER BALUN, HYBRID INTEGRATED CIRCUIT MODULE, AND MULTILAYER SUBSTRATE

(75) Inventor: Shimpei Oshima, Gunma (JP)

(73) Assignee: Taiyo Yuden Co., Ltd. (JP)

( * ) Notice: Subject to any disclaimer, the term of this patent is extended or adjusted under 35 U.S.C. 154(b) by 54 days.

(21) Appl. No.: 11/948,878

(22) Filed: Nov. 30, 2007

(65) Prior Publication Data

US 2008/0258838 A1      Oct. 23, 2008

(30) Foreign Application Priority Data

Dec. 8, 2006      (JP)      .............................. 2006-331677

(51) Int. Cl.
 *H03H 7/42*      (2006.01)
 *H01P 3/08*      (2006.01)
(52) U.S. Cl. ........................................ 333/26; 333/238
(58) Field of Classification Search ................... 333/25, 333/26, 238, 246
 See application file for complete search history.

(56) References Cited

U.S. PATENT DOCUMENTS

| | | | | |
|---|---|---|---|---|
| 6,483,415 B1 * | 11/2002 | Tang | ........................... | 336/200 |
| 7,183,872 B2 * | 2/2007 | Lee et al. | ....................... | 333/26 |
| 7,511,591 B2 * | 3/2009 | Ezzendine | .................... | 333/26 |

FOREIGN PATENT DOCUMENTS

| | | |
|---|---|---|
| JP | 2773617 | 4/1998 |
| JP | 11-219824 | 8/1999 |
| JP | 2990652 | 10/1999 |

* cited by examiner

*Primary Examiner*—Dean O Takaoka
(74) *Attorney, Agent, or Firm*—Chen Yoshimura LLP

(57) ABSTRACT

A multilayer balun comprises first and second transmission lines that constitute a half-wave transmission line are opposed in adjacent layers, with a dielectric substance therebetween, so that, during use, the current of the first transmission line and the current of the second transmission line flow in the same direction. Thus, magnetic shield is formed between the first and second transmission lines. This eliminates the need for a grounding electrode layer for preventing magnetic interference between the first and second transmission lines.

12 Claims, 12 Drawing Sheets

PRIOR ART

[Fig. 16]

PRIOR ART

[Fig. 17]

PRIOR ART

[Fig. 18]

PRIOR ART

MULTILAYER BALUN, HYBRID INTEGRATED CIRCUIT MODULE, AND MULTILAYER SUBSTRATE

BACKGROUND OF THE INVENTION

1. Field of the Invention

The present invention relates to multilayer baluns, and in particular, to a multilayer balun for use as a balanced-to-unbalanced transformer or a phase transformer of ICs for radio communication equipment, a hybrid integrated circuit module having the same, and a multilayer substrate.

2. Description of the Related Technology

Figure 15:
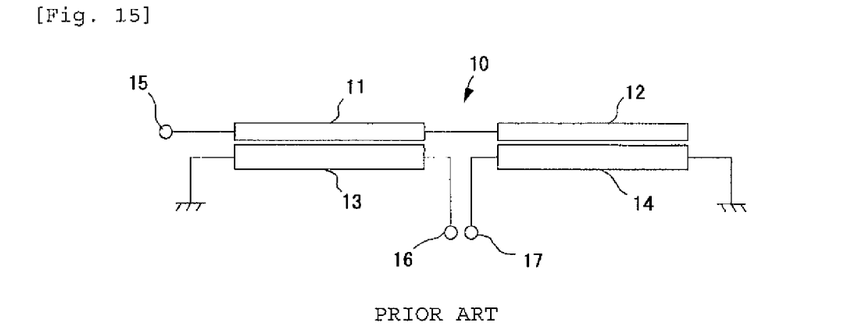
FIG. 15 is an equivalent circuit diagram of a Marchand balun.

The Marchand balun shown in FIG. 15 is generally used as a balanced-to-unbalanced signal circuit for high frequency signals. The Marchand balun 10 is a distributed constant circuit with a simple structure. That is, the Marchand balun 10 includes two quarter-wave transmission lines 11 and 12 which are connected in series. An open end of the quarter-wave transmission line 11 is connected to an unbalanced terminal 15. The two quarter-wave transmission lines 11 and 12 constitute a half-wave transmission line. Furthermore, a quarter-wave transmission line 13 is opposed to the quarter-wave transmission line 11, and a quarter-wave transmission line 14 is opposed to the quarter-wave transmission line 12. The end of the quarter-wave transmission line 13 adjacent to the unbalanced terminal 15 of the quarter-wave transmission line 11 is grounded, and the other end is connected to a balanced terminal 16. The end of the quarter-wave transmission line 14 adjacent to the connection of the quarter-wave transmission line 11 and the quarter-wave transmission line 12 is connected to a balanced terminal 17, and the other end is grounded.

Since the Marchand balun 10 has a simple structure as described above, it has the advantage of providing preferable characteristics in a high frequency band even with a small size. In view of this technical background and because of recent widespread use of radio equipment, parts manufacturers are working on the development of multilayer Marchand baluns.

Known examples of this type of multilayer baluns are a balun transformer disclosed in Japanese Patent No. 2773617 and a, multilayer balun transformer disclosed in Japanese Patent No. 2990652.

Figure 16:
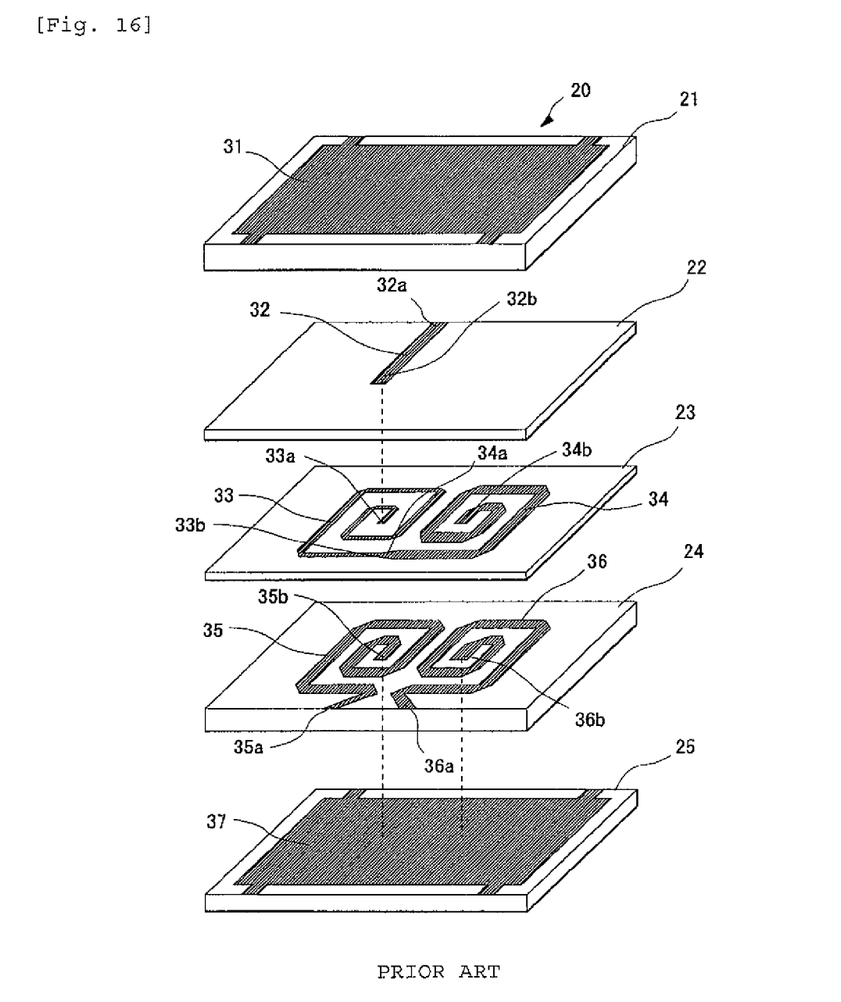
FIG. 16 is an exploded perspective view of a multilayer balun transformer of a conventional example.

As shown in FIG. 16, a balun transformer 20 disclosed in Japanese Patent No. 2773617 has dielectric substrates 21 to 25 stacked in that order, on each of which an earth electrode or a stripline is formed. That is, the uppermost first dielectric substrate 21 has an earth electrode 31 which is connected to a grounding external terminal electrode (not shown). The upper surface of the second dielectric substrate 22 has a straight stripline 32, whose first end 32a is connected to an unbalanced external terminal (not shown). The upper surface of the third dielectric substrate 23 has spiral striplines 33 and 34 constituting the above-mentioned half-wave transmission line. The striplines 33 and 34 are substantially symmetrical about the center of the dielectric substrate 23. A first end 33a of the stripline 33 at the center of the spiral is connected to a second end 32b of the stripline 32 through a via conductor (not shown). A second end 33b of the stripline 33 is connected to a first end 34a of the stripline 34 located outside the spiral, while a second end 34b of the stripline 34 at the center of the spiral is open.

The upper surface of the fourth dielectric substrate 24 has two spiral striplines 35 and 36 that constitute the above-mentioned two quarter-wave transmission lines, the striplines 35 and 36 being opposed to the striplines 33 and 34, respectively. A first end 35a of the stripline 35 opposed to the stripline 33 is connected to a first balanced external terminal (not shown). A second end 35b of the stripline 35 is connected to an earth electrode 37 formed on the upper surface of the fifth dielectric substrate 25 through a via conductor (not shown). A first end 36a of the stripline 36 opposed to the stripline 34 is connected to a second balanced external terminal (not shown). A second end 36b of the stripline 36 is connected to the earth electrode 37 on the fifth dielectric substrate 25 through a via conductor (not shown). The earth electrode 37 is connected to a grounding external terminal electrode (not shown).

Thus, the Marchand balun (balun transformer) shown in FIG. 15 is formed.

Figure 17:
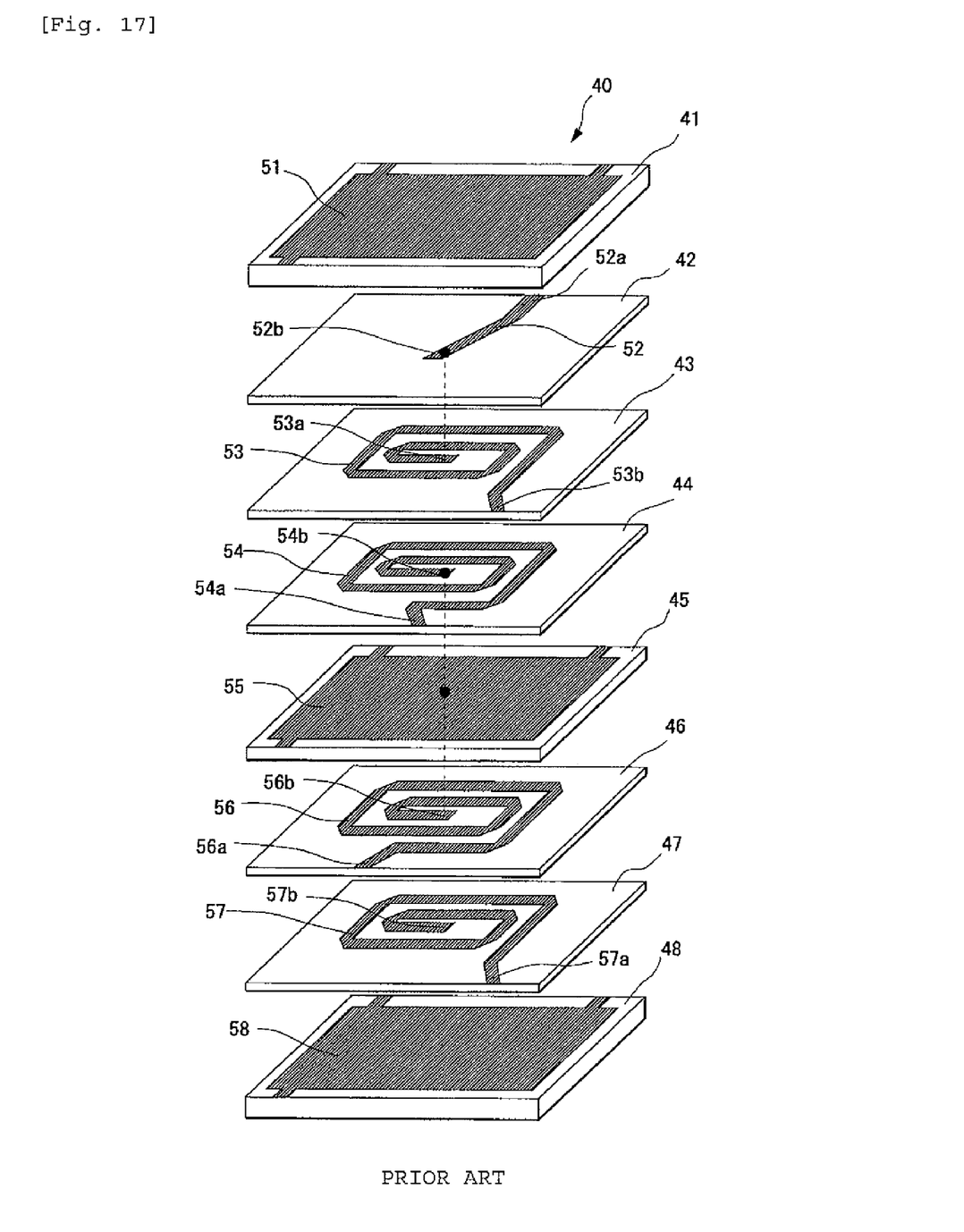
FIG. 17 is an exploded perspective view of a multilayer balun transformer of a conventional example.

As shown in FIG. 17, a multilayer balun transformer 40 disclosed in Japanese Patent No. 2990652 has spiral striplines on different layers so that the mounting area for the balun transformer 20 is reduced.

Specifically, the multilayer balun transformer 40 is formed of dielectric substrates 41 to 48 layered in that order, on each of which an earth electrode or a stripline is formed. That is, the uppermost first dielectric substrate 41 has an earth electrode 51 which is connected to a grounding external terminal electrode (not shown). The upper surface of the second dielectric substrate 42 has a substantially straight stripline 52, whose first end 52a is connected to an unbalanced outside terminal (not shown). The upper surface of the third dielectric substrate 43 has a spiral stripline 53 constituting a half of the above-mentioned half-wave transmission line. A first end 53a of the stripline 53 at the center of the spiral is connected to a second end 52b of the stripline 52 through a via conductor (not shown). A second end 53b of the stripline 53 is connected to a first end 57a of a stripline 57 outside the spiral, to be described later.

The upper surface of the fourth dielectric substrate 44 has a spiral stripline 54 that constitutes one of the above-mentioned quarter-wave transmission lines in such a manner that the stripline 54 is opposed to the stripline 53. A first end 54a of the stripline 54 outside the spiral is connected to one balanced external terminal (not shown). A second end 54b of the stripline 54 at the center of the spiral is connected to an earth electrode 55 formed on the fifth dielectric substrate 45 through a via conductor (not shown).

The upper surface of the fifth dielectric substrate 45 has the earth electrode 55 which is connected to a grounding external terminal electrode (not shown).

The upper surface of the sixth dielectric substrate 46 has a spiral stripline 56 that constitutes the other of the above-mentioned quarter-wave transmission line in such a manner that the stripline 56 is opposed to the stripline 57. A first end 56a of the stripline 56 outside the spiral is connected to the other balanced external terminal (not shown). A second end 56b of the stripline 56 at the center of the spiral is connected to the earth electrode 55 formed on the fifth dielectric substrate 45 through a via conductor (not shown).

The upper surface of the seventh dielectric substrate 47 has a spiral stripline 57 that constitutes a half of the above-mentioned half-wave transmission lines. A first end 57a of the stripline 57 outside the spiral is connected to the second end 53b of the stripline 53 through an external electrode (not shown). A second end 57b of the stripline 57 is open.

The upper surface of the eighth dielectric substrate 48 has an earth electrode 58 which is connected to a grounding external terminal electrode (not shown).

Thus the Marchand balun (balun transformer) shown in FIG. 15 is formed.

Figure 18:
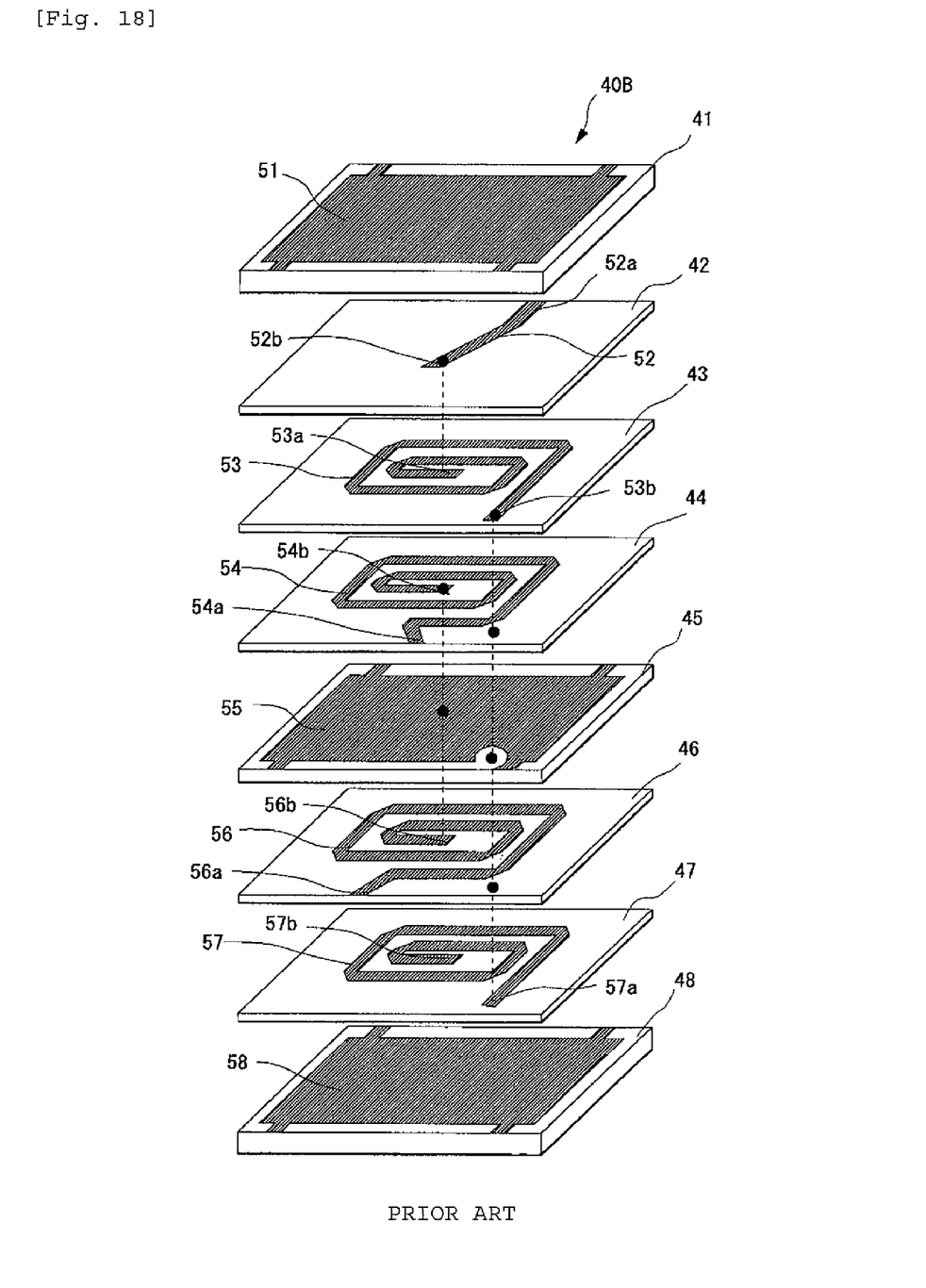
FIG. 18 is an exploded perspective view of a multilayer balun transformer of a conventional example.

Japanese Patent No. 2990652 further discloses a multilayer balun transformer 40B shown in FIG. 18, in which two quarter-wave striplines 53, 57 that constitute a half-wave transmission line are connected by via conductors in place of the external electrode.

The balun transformer disclosed in Japanese Patent No. 2773617 has a conventional structure in which a Marchand balun is of a multilayer type. This has the problem of difficulty in reducing the size because it needs an area for the half-wave stripline. Although this balun transformer can be reduced in height, the interval between the stripline and each earth electrode is reduced. This increases the coupling capacity between them, posing the problem of difficulty in impedance matching.

The multilayer balun transformer disclosed in Japanese Patent No. 2990652 has two-layered half-wave transmission lines, so that it has an advantage in that the balun can be formed in an area half or smaller than the balun transformer disclosed in Japanese Patent No. 2773617. This further has an advantage in that the impedance of the quarter-wave striplines on the balanced input and output sides can be adjusted independently. However, this balun transformer has a ground plane between the two-layered half-wave transmission lines to prevent deterioration of the characteristics due to electromagnetic coupling. Therefore, it has the problem of difficulty in reducing the height.

SUMMARY OF CERTAIN INVENTIVE ASPECTS

Certain inventive aspects relate to a compact multilayer balun transformer, a hybrid integrated circuit module, and a multilayer substrate.

A multilayer balun transformer according to a first aspect of the invention has a half-wave transmission line, a quarter-wave transmission line opposed to a first half of the half-wave transmission line, with a dielectric substance therebetween, and a quarter-wave transmission line opposed to a second half of the half-wave transmission line, with a dielectric substance therebetween. The multilayer balun transformer includes: a first dielectric layer having a first transmission line that constitutes the first half of the half-wave transmission line; a second dielectric layer stacked next to the first dielectric layer and having a second transmission line that constitutes the second half of half-wave transmission line and is opposed to the first transmission line, with a dielectric substance therebetween so that, during use, the current flows in the same direction as that of the first transmission line; connecting means for conductive-connecting the first transmission line and the second transmission line which are opposed each other, with the dielectric substance therebetween, so that their currents flow in the same direction; a third dielectric layer stacked next to the first dielectric layer and having a third transmission line constituting a first quarter-wave transmission line in such a manner as to electromagnetically couple with the first transmission line, with a dielectric substance therebetween; a fourth dielectric layer stacked next to the second dielectric layer and having a fourth transmission line constituting a second quarter-wave transmission line in such a manner as to electromagnetically couple with the second transmission line, with a dielectric substance therebetween; a first grounding electrode layer stacked next to the third dielectric layer in such a manner as to be opposed to the third transmission line, with a dielectric substance therebetween; and a second grounding electrode layer stacked next to the fourth dielectric layer in such a manner as to be opposed to the fourth transmission line, with a dielectric substance therebetween. Thus, the above object can be achieved.

According to the first aspect of the invention, the first transmission line and the second transmission line that constitute a half-wave transmission line are disposed in adjacent layers, with a dielectric substance therebetween, and moreover, the first transmission line and the second transmission line are stacked so that the currents flows in the same direction during use. Thus, the magnetic field generated around the first transmission line due to the current of the first transmission line and the magnetic field generated around the second transmission line due to the current of the second transmission line cancel each other in the gap between the first transmission line and the second transmission line to form magnetic shield between the first and second transmission lines. This eliminates the need for the grounding electrode layer for preventing magnetic interference between the first and second transmission lines. This allows the multilayer balun to be reduced in size and height. This facilitates application to a compact multilayer balance filter that combines a filter and a balun, and facilitates manufacturing as compared with conventional ones because the grounding electrode of the intermediate layer can be omitted.

Moreover, one end of the half-wave transmission line is conductive-connected to an external terminal electrode on the same layer as that of one of the first transmission line and the second transmission line, and no other wiring layer is provided in the area in which the first transmission line and the second transmission line are opposed, so that good magnetic shield can be formed.

A multilayer balun according to a second aspect of the invention has a half-wave transmission line, a quarter-wave transmission line opposed to a first half of the half-wave transmission line, with a dielectric substance therebetween, and a quarter-wave transmission line opposed to a second half of the half-wave transmission line, with a dielectric substance therebetween. The multilayer balun includes: a first dielectric layer having a first transmission line that constitutes the first half of the half-wave transmission line; a second dielectric layer stacked next to the first dielectric layer and having a second transmission line that constitutes the second half of the half-wave transmission line and is opposed to the first transmission line, with a dielectric substance therebetween, so as to achieve capacitive coupling; a third dielectric layer stacked next to the first dielectric layer and having a third transmission line that constitutes a first quarter-wave transmission line and is opposed to the first transmission line, with a dielectric substance therebetween, so as to achieve magnetic coupling; a fourth dielectric layer stacked next to the second dielectric layer and having a fourth transmission line constituting a second quarter-wave transmission line in such a manner as to electromagnetically couple with the second transmission line, with a dielectric substance therebetween; a first grounding electrode layer stacked next to the third dielectric layer in such a manner as to be opposed to the third transmission line, with a dielectric substance therebetween; and a second grounding electrode layer stacked next to the fourth dielectric layer in such a manner as to be opposed to the fourth transmission line, with a dielectric substance therebetween. Thus, the above object can be achieved.

According to the second aspect of the invention, the first transmission line and the second transmission line that constitute a half-wave transmission line are disposed in adjacent layers, with a dielectric substance therebetween, and moreover, the first transmission line and the second transmission line are stacked, with a dielectric substance therebetween, so as to achieve capacitive coupling. This produces a wavelength reducing effect in the half-wave transmission line formed of the first transmission line and the second transmission line, so that the first transmission line and the second transmission line can be decreased in length, thus allowing reduction of the size. This facilitates application to a compact multilayer balance filter that combines a filter and a balun, and facilitates manufacturing as compared with conventional ones because the grounding electrode of the intermediate layer can be omitted.

Moreover, one end of the half-wave transmission line is conductive-connected to an external terminal electrode on the same layer as that of one of the first transmission line and the second transmission line and no other wiring layer is provided in the area in which the first transmission line and the second transmission line are opposed, so that good capacitive coupling is achieved.

According to a third aspect of the invention, there are provided a hybrid integrated circuit module including the multilayer balun and a multilayer substrate in which the multilayer balun is formed. Thus, the above object can be achieved.

According to the third aspect of the invention, the multilayer balun is the multilayer balun according to one of the first and second aspects. This allows the multilayer balun transformer to be decreased in size and height, so that the multilayer balun can easily be disposed in the multilayer substrate.

DETAILED DESCRIPTION OF CERTAIN EMBODIMENTS

Figure 1:
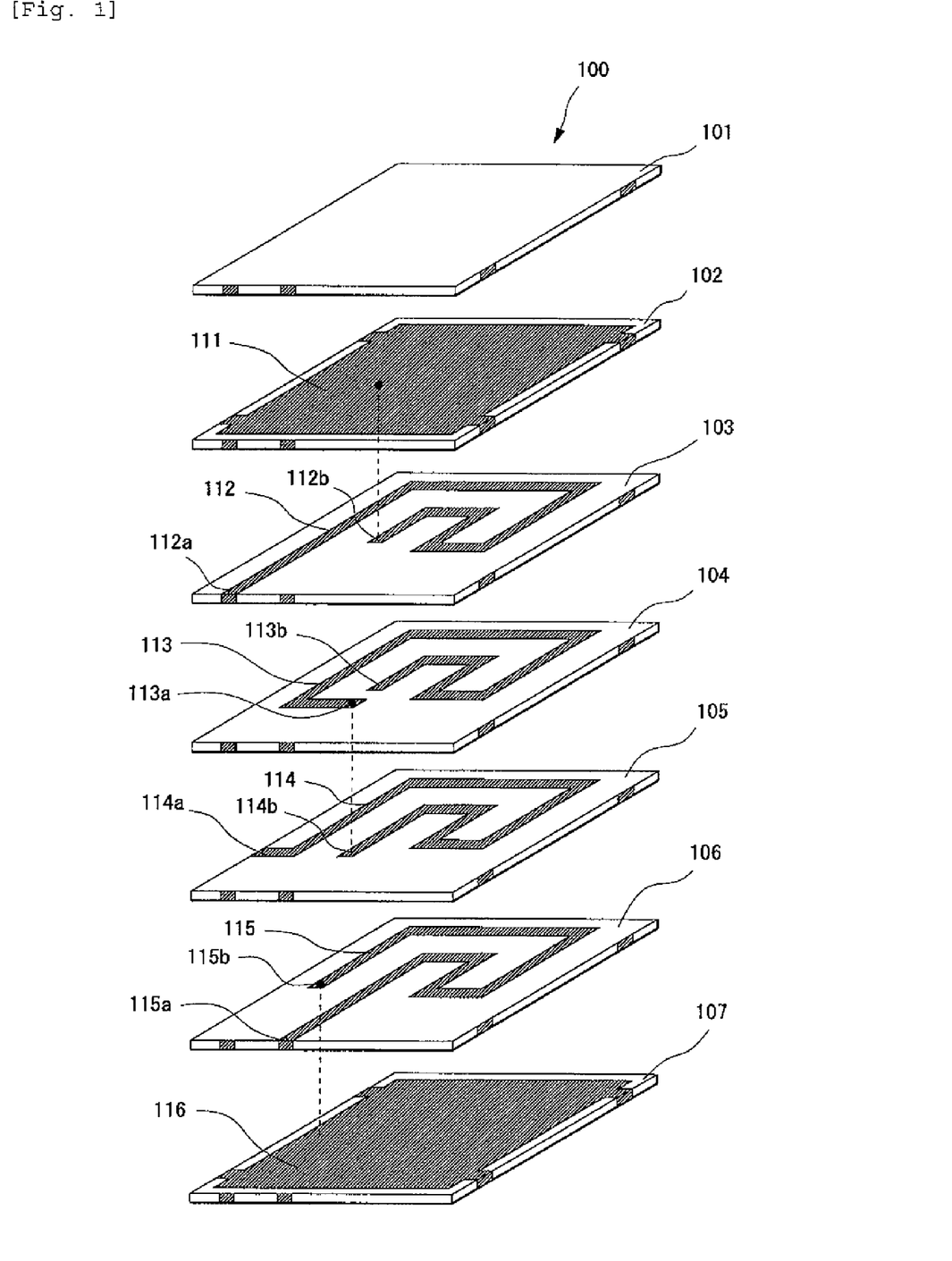
FIG. 1 is an exploded perspective view of a multilayer balun according to a first embodiment of the invention.

FIG. 1 is an exploded perspective view of a multilayer balun according to a first embodiment of the invention. The multilayer balun 100 has vertically stacked seven plate-like dielectric layers 101 to 107 of a predetermined thickness.

The uppermost dielectric layer 101 is a dummy layer for protecting a grounding electrode layer 111 formed on the upper surface of the second dielectric layer 102.

The upper surface of the second dielectric layer 102 except part of the periphery has the grounding electrode layer 111 which is conductive-connected to a grounding external terminal electrode at positions of the periphery.

The upper surface of the third dielectric layer 103 has a transmission line 112 that constitutes the quarter-wave transmission line 14 of the Marchand balun 10. The transmission line 112 partly meanders (in a meandering shape), whose first end 112a is conductive-connected to an external terminal electrode, and a second end 112b is conductive-connected to the grounding electrode layer 111 through a via conductor.

The upper surface of the fourth dielectric layer 104 has a transmission line 113 that constitutes a half of the half-wave transmission line of the Marchand balun 10, that is, the quarter-wave transmission line 12. The transmission line 113 has substantially the same partly meandering shape as the transmission line 112, and is opposed to the transmission line 112 so as to agree therewith, with a dielectric substance therebetween. A first end 113a of the transmission line 113 (opposed to the first end 112a of the transmission line 112) is conductive-connected to a second end 114b of a transmission line 114 formed on the fifth dielectric layer 105 through a via conductor. A second end 113b of the transmission line 113 (opposed to the second end 112b of the transmission line 112) is open.

The upper surface of the fifth dielectric layer 105 has the transmission line 114 that constitutes the other half of the half-wave transmission line of the Marchand balun 10, that is, the quarter-wave transmission line 11. The transmission line 114 has substantially the same partly meandering shape as the transmission line 113, and is opposed to the transmission line 113 so as to agree therewith, with a dielectric substance therebetween. A first end 114a of the transmission line 114 (opposed to the first end 113a of the transmission line 113) is conductive-connected to an external terminal electrode (not shown) on the upper surface of the fifth dielectric layer 105. A second end 114b of the transmission line 114 (opposed to the second end 113b of the transmission line 113) is conductive-connected to the first end 113a of the fourth transmission line 113 through a via conductor.

The upper surface of the sixth dielectric layer 106 has a transmission line 115 that constitutes the quarter-wave transmission line 13 of the Marchand balun 10. The transmission line 115 partly meanders (in a meandering shape) and has substantially the same shape as the transmission line 114 so as to be opposed to the transmission line 114 and agreed therewith, with a dielectric substance therebetween. A first end 115a of the transmission line 115 (opposed to the second end 114b of the transmission line 114) is conductive-connected to an external terminal electrode. A second end 115b of the transmission line 115 (opposed to the first end 114a of the transmission line 114) is conductive-connected to a grounding electrode layer 116 through a via conductor.

The upper surface of the seventh dielectric layer 107 except part of the periphery has the grounding electrode layer 116 which is conductive-connected to a grounding external terminal electrode at positions of the periphery.

Thus, the multilayer balun 100 constituting the Marchand balun 10 is formed. This multilayer balun 100 has the transmission line 113 serving as a half of the half-wave transmission line and the transmission line 114 serving as the other half of the half-wave transmission line which are disposed in adjacent layers, with a dielectric substance therebetween. The transmission lines 113 and 114 are disposed in layers and conductive-connected such that the currents of the transmission lines 113 and 114 flow in the same direction during use. Thus, the magnetic field generated around the transmission line 113 due to the current of the transmission line 113 and the magnetic field generated around the transmission line 114 due to the current of the transmission line 114 cancel each other in the gap between the transmission lines 113 and 114 to form magnetic shield between the transmission lines 113 and 114. This prevents unnecessary magnetic coupling between the transmission lines 113 and 114 which extremely deteriorates the characteristics of the balun, thus eliminating the need for the grounding electrode layer for preventing magnetic interference between the transmission lines 113 and 114, as in the conventional example.

Figure 2:
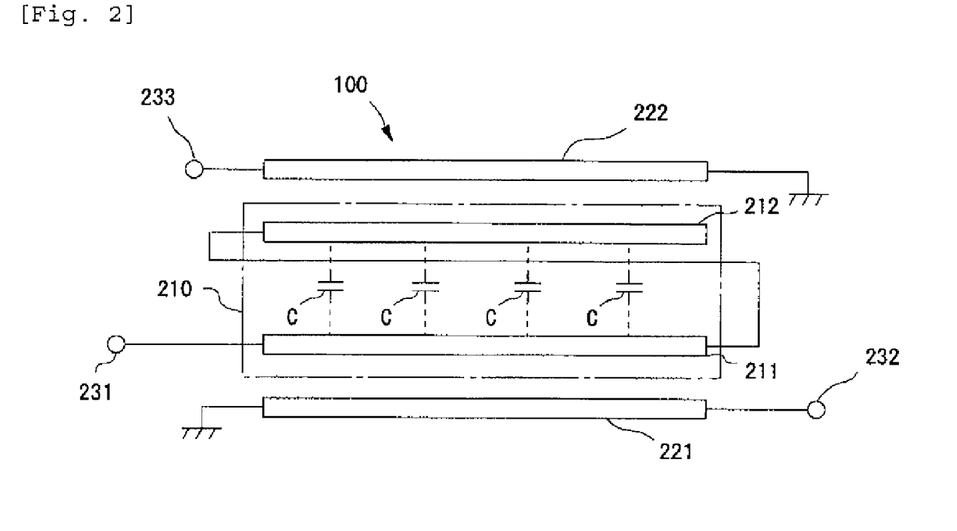
FIG. 2 is an equivalent circuit diagram of the multilayer balun according to the first embodiment of the invention.

Furthermore, the transmission lines 113 and 114 constituting a half-wave transmission line are disposed in layers, with a dielectric substance therebetween, so as to achieve capacitive coupling to generate electrostatic capacitance C between the transmission lines 113 and 114, as shown in FIG. 2. This produces a wavelength decreasing effect on the half-wave transmission line formed of the transmission lines 113 and 114, allowing the transmission lines 113 and 114 to be reduced in length.

FIG. 2 is an equivalent circuit diagram of the multilayer balun 100. In the drawing, two quarter-wave transmission lines 211 and 212 in series which constitute a half-wave transmission line 210 correspond to the transmission lines 114 and 113, respectively. One end of the transmission line 211 is connected to an unbalanced external terminal electrode 231, and the other end of the transmission line 212 is open. A quarter-wave transmission line 221 corresponds to the transmission line 115, one end of which is connected to a first balanced external terminal electrode 232, and the other end is grounded. A quarter-wave transmission line 222 corresponds to the transmission line 112, whose one end is connected to a second balanced external terminal electrode 233, and the other end is grounded.

Thus, the multilayer balun 100 can be decreased in size and height as compared with the conventional ones. The use of the multilayer balun 100 facilitates application to a compact multilayer balance filter that combines a filter and a balun, and facilitates manufacturing as compared with conventional ones because the grounding electrode of the intermediate layer in the conventional example can be omitted.

Figure 3:
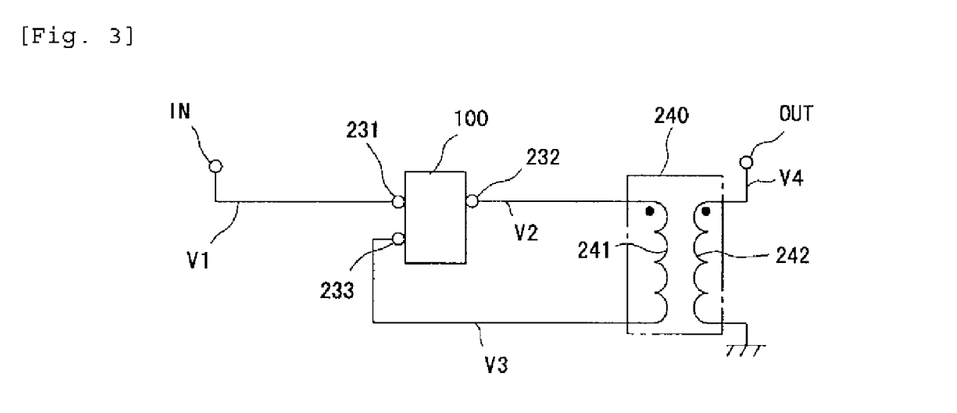
FIG. 3 is a block diagram of an evaluation circuit of the multilayer balun according to the first embodiment of the invention.
Figure 4:
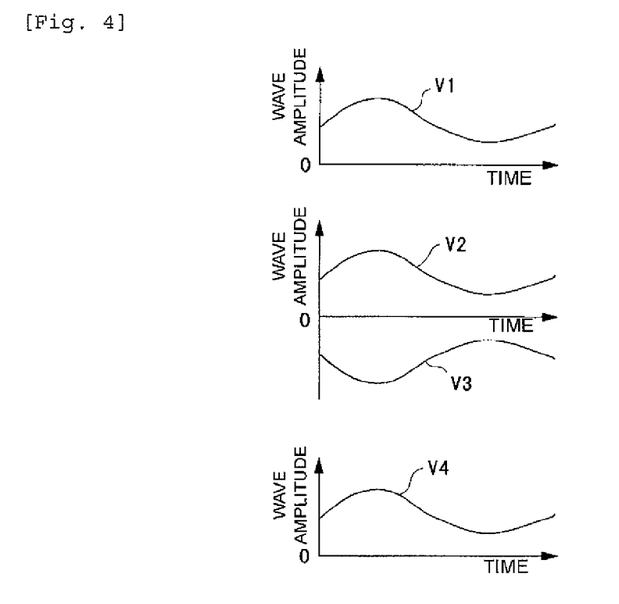
FIG. 4 shows wave amplitudes of the evaluation circuit according to the first embodiment of the invention.
Figure 5:
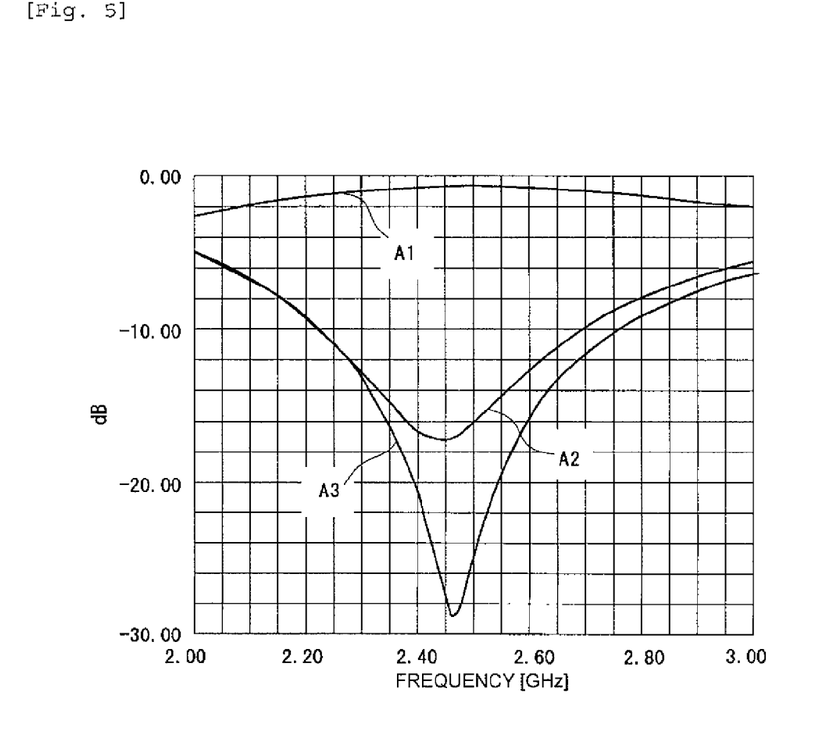
FIG. 5 is a diagram showing the frequency characteristics of the multilayer balun according to the first embodiment of the invention.
Figure 6:
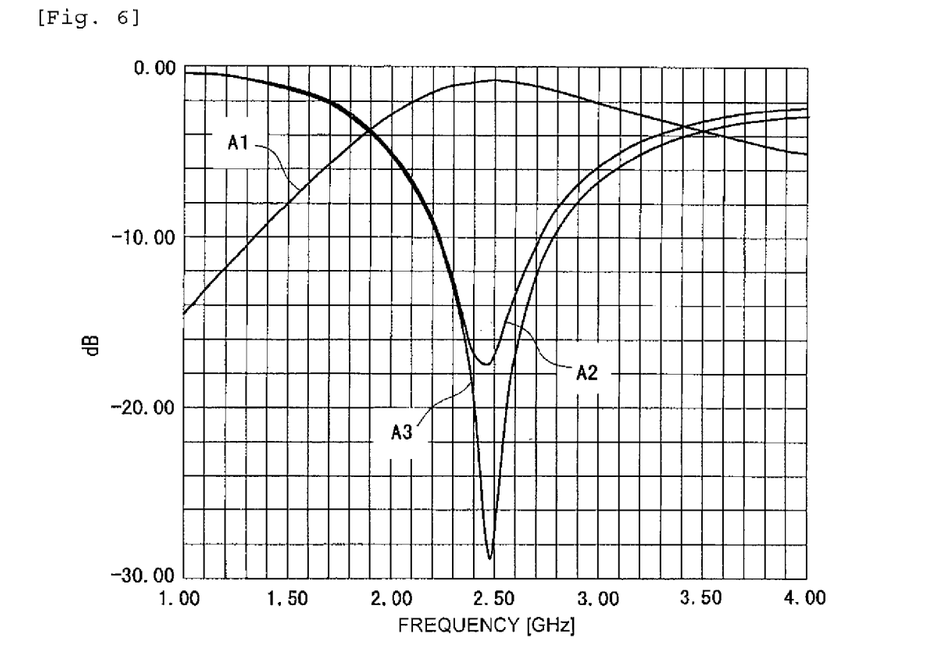
FIG. 6 is a diagram showing the frequency characteristics of the multilayer balun according to the first embodiment of the invention.
Figure 7:
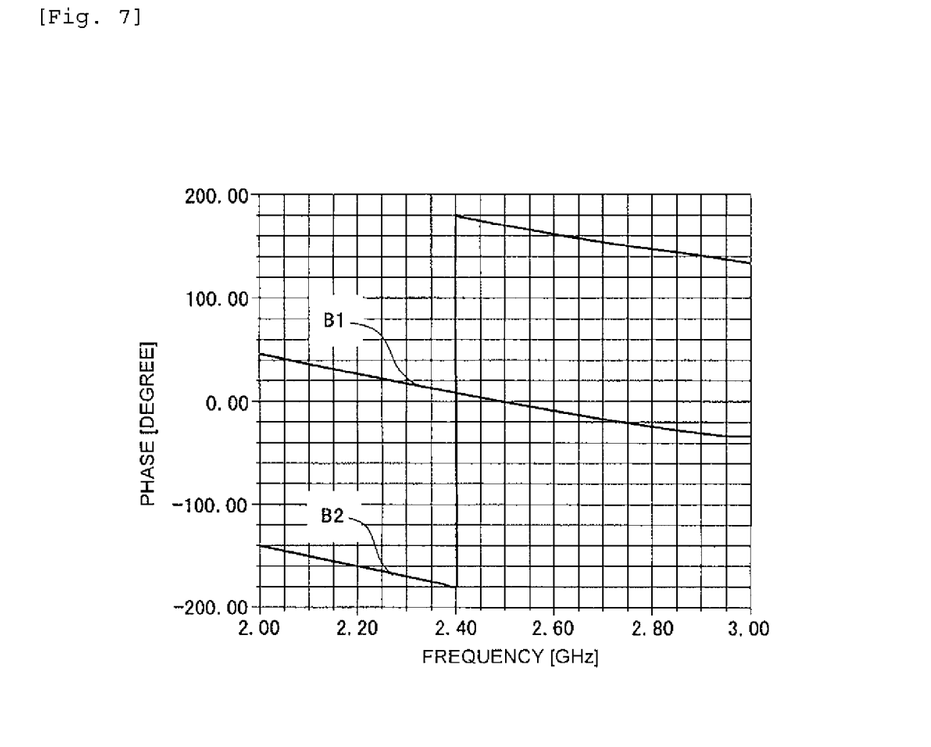
FIG. 7 is a diagram showing the phase characteristics of the multilayer balun according to the first embodiment of the invention.
Figure 8:
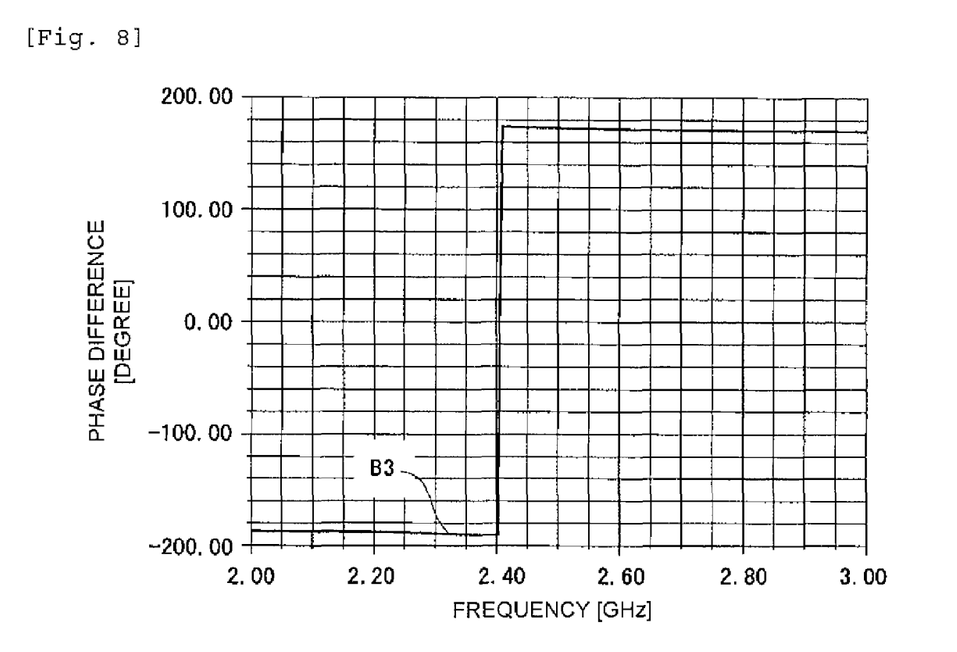
FIG. 8 is a diagram showing the phase characteristics of the multilayer balun according to the first embodiment of the invention.
Figure 9:
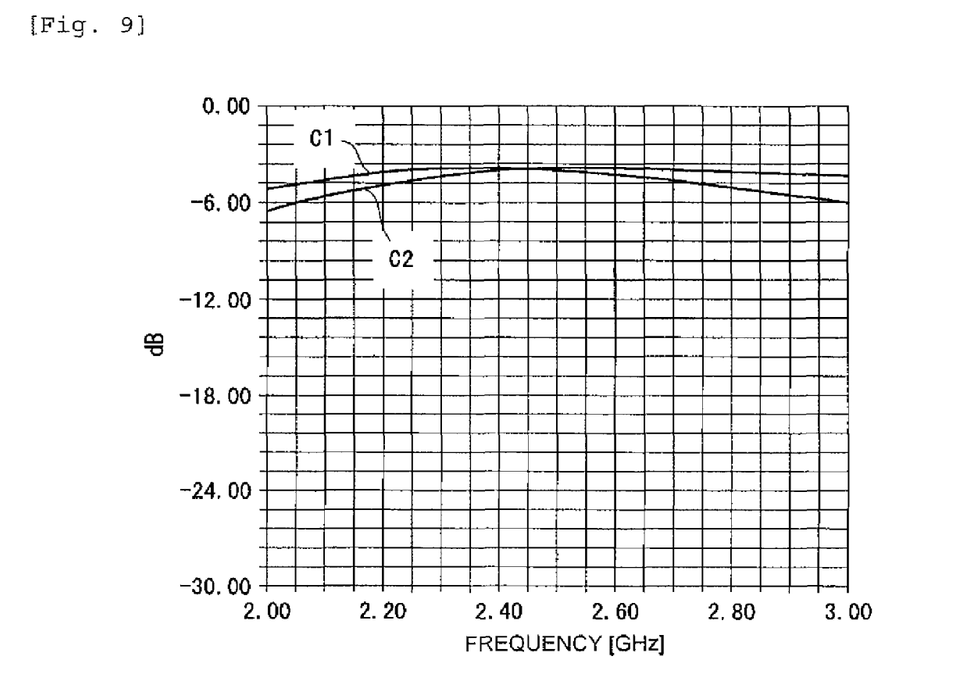
FIG. 9 is a diagram showing the amplitude characteristics of the multilayer balun according to the first embodiment of the invention.
Figure 10:
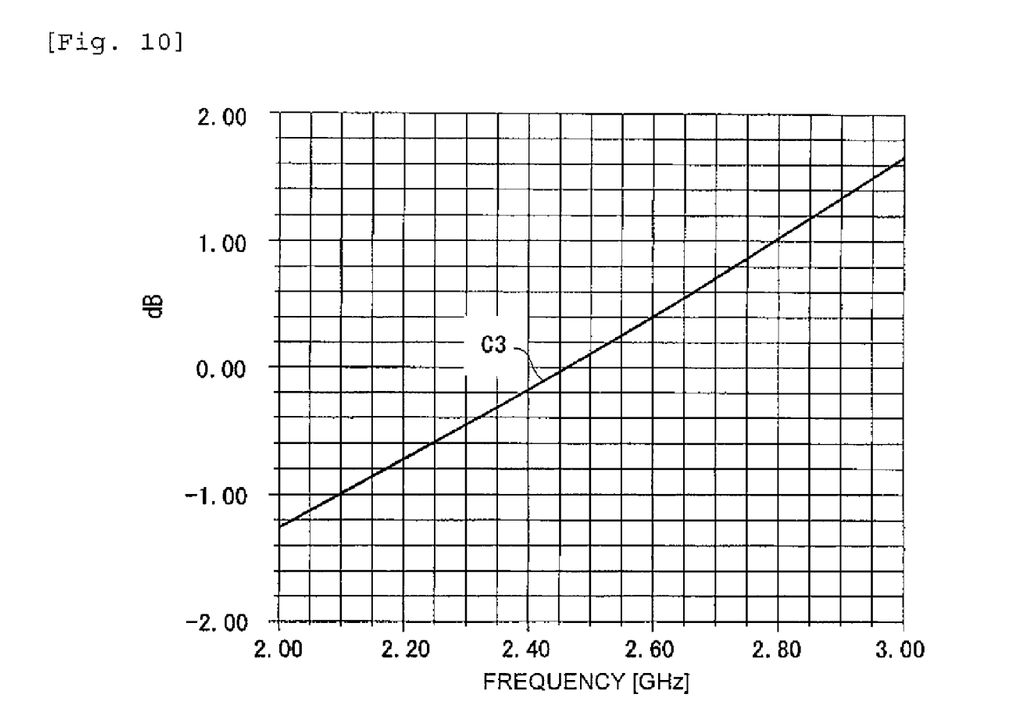
FIG. 10 is a diagram showing the amplitude characteristics of the multilayer balun according to the first embodiment of the invention.

Referring to FIGS. 3 to 10, the characteristics of the multilayer balun 100 will be described. FIG. 3 is a diagram of an evaluation circuit for obtaining the characteristics of the multilayer balun 100. FIG. 4 shows wave amplitudes of the evaluation circuit. FIGS. 5 and 6 show characteristic curves indicative of the insertion loss of the multilayer balun 100. FIGS. 7 and 8 show the phase and the phase difference of the wave amplitude of the balanced terminal of the multilayer balun 100, respectively. FIGS. 9 and 10 show the amplitude and the amplitude difference of the wave amplitude of the balanced terminal of the multilayer balun 100.

Referring to FIG. 3, a balun 240 is an ideal balun having no loss and no reflection, whose one balanced terminal is connected to the first balanced external terminal electrode 232, and the other balanced terminal is connected to the second balanced external terminal electrode 233 of the multilayer balun 100. The unbalanced external terminal electrode 231 of the multilayer balun 100 is connected to an input terminal IN, and the unbalanced terminal of the balun 240 is connected to an output terminal OUT. In the evaluation circuit of FIG. 3, when wave amplitude V1 (see FIG. 4) is applied to the input terminal IN, wave amplitude V2 (see FIG. 4) is output to the first balanced external terminal electrode 232, and wave amplitude V3 (see FIG. 4) is output to the second balanced external terminal electrode 233. Wave amplitude V4 (see FIG. 4) is output to the output terminal OUT.

Referring to FIGS. 5 and 6, symbol A1 denotes a characteristic curve indicative of the incident of the multilayer balun 100 as viewed from the input terminal IN, symbol A2 denotes a characteristic curve indicative of the reflection of the multilayer balun 100 as viewed from the input terminal IN, and symbol A3 denotes a characteristic curve indicative of the reflection of the multilayer balun 100 as viewed from the output terminal OUT. FIGS. 5 and 6 are different in the range of frequency. The incident A1 exhibits the maximum value in the vicinity of 2.45 GHz, and the input-side reflection A2 and the output-side reflection A3 exhibit the minimum value in the vicinity of 2.45 GHz.

Referring to FIGS. 7 and 8, symbol B1 denotes the phase of the wave amplitude V2 output from the first balanced external terminal electrode 232 when the wave amplitude V1 to the input terminal IN is input, and symbol B2 denotes the phase of the wave amplitude V3 output from the second balanced external terminal electrode 233 when the wave amplitude V1 is input to the input terminal IN. Symbol B3 denotes the phase difference calculated by subtracting the phase B1 from the phase B2.

Referring to FIGS. 9 and 10, symbol C1 denotes the characteristic of the wave amplitude V2 output from the first balanced external terminal electrode 232 when the wave amplitude V1 is input, and symbol C2 denotes the characteristic of the wave amplitude V3 output from the second balanced external terminal electrode 233 when the wave amplitude V1 is input. Symbol C3 denotes a value calculated by subtracting the absolute value C1 from the absolute value C2.

Thus, the multilayer balun 100 of this embodiment has practical characteristics.

Figure 11:
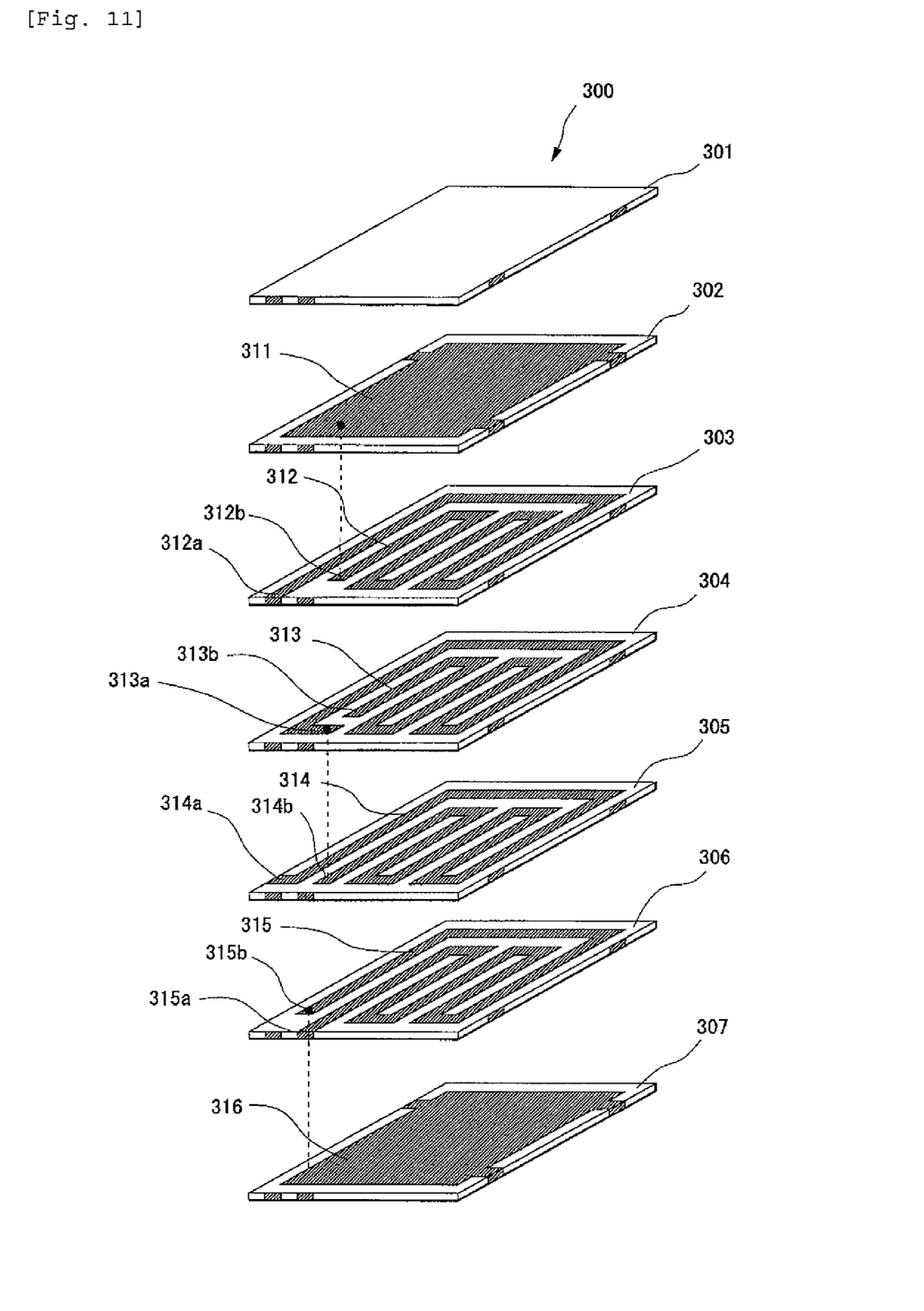
FIG. 11 is an exploded perspective view of a multilayer balun according to a second embodiment of the invention.

While the number of meander of the transmission lines 112 to 115 is small in the first embodiment, the number of meander is not limited to that. For example, when the number of meander of the transmission lines 312 to 315 is increased as in a multilayer balun 300 according to a second embodiment shown in FIG. 11, the transmission line formation area can be reduced at the same frequency. To make the currents of the first and second spiral transmission lines flow in the same direction, as in the first embodiment, an area in which the first and second transmission lines are not opposed is produced. Forming the transmission lines 312 to 315 in a meandering shape increases an area in which the transmission lines 312 to 315 are opposed as compared with the spiral shape, providing close-to-ideal magnetic shield. Thus, with the same formation area, the transmission line can be increased in length, so that the frequency can be set low. Thus, the multilayer balun 300 can be reduced in size. In the multilayer balun 300 of the second embodiment shown in FIG. 11, dielectric layers 301 to 307 correspond to the dielectric layers 101 to 107 of the multilayer balun 100 according to the first embodiment. Grounding electrode layers 311 and 316 correspond to the grounding electrode layers 111 and 116, and transmission lines 312 to 315 correspond to the transmission lines 112 to 115. The transmission lines 312 to 315 of the second embodiment are also disposed so as to agree with one another with a dielectric substance therebetween.

A multilayer balun according to a third embodiment will be described.

Figure 12:
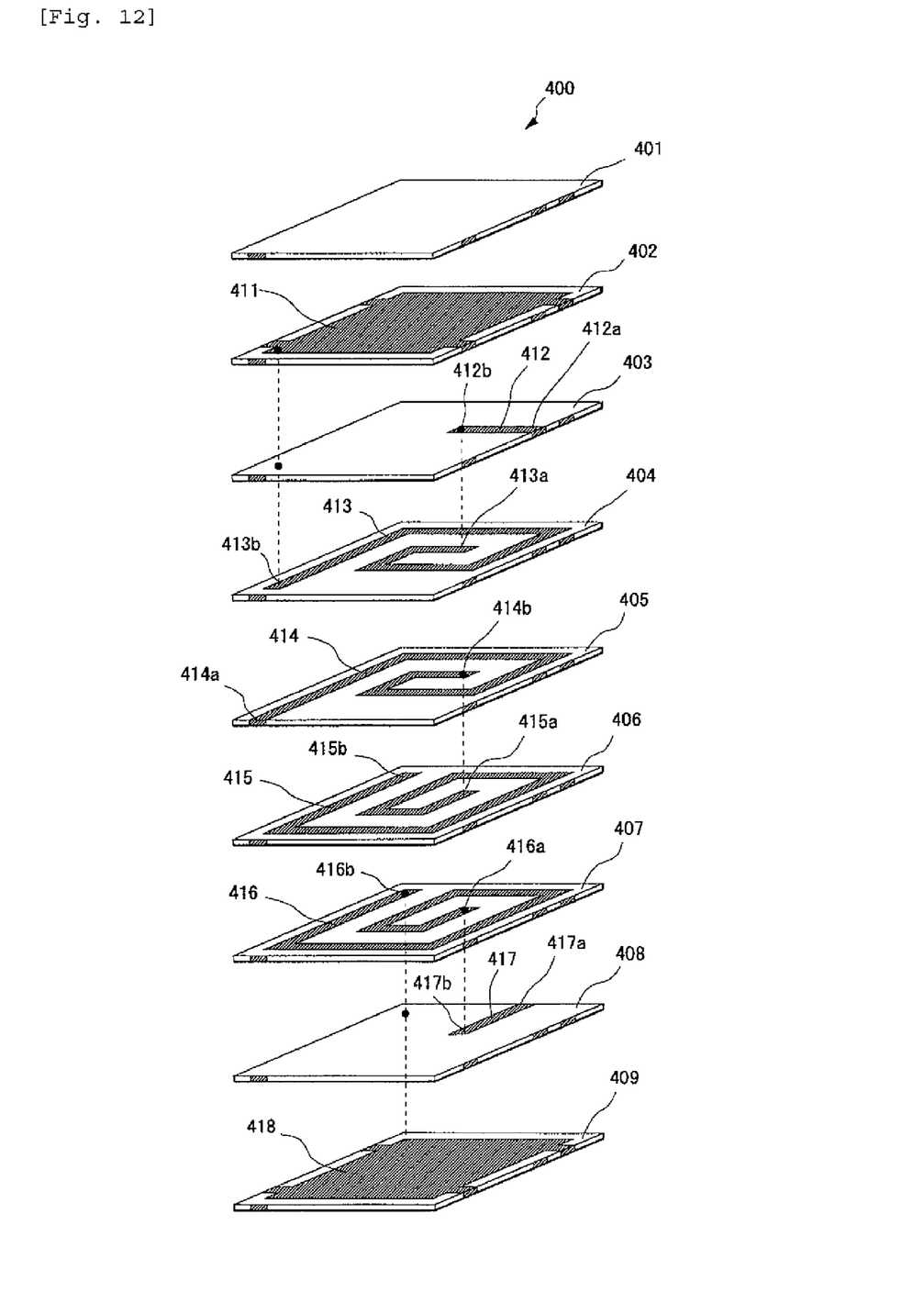
FIG. 12 is an exploded perspective view of a multilayer balun according to a third embodiment of the invention.

FIG. 12 is an exploded perspective view of a multilayer balun according to a third embodiment of the invention. The multilayer balun 400 is composed of nine plate-like dielectric layers 401 to 409 of a predetermined thickness which are stacked vertically.

The uppermost dielectric layer 401 is a dummy layer for protecting a grounding electrode layer 411 formed on the upper surface of the second dielectric layer 402.

The upper surface of the second dielectric layer 402 except part of the periphery has the grounding electrode layer 411 which is conductive-connected to a grounding external terminal electrode at positions of the periphery.

The upper surface of the third dielectric layer 403 has a transmission line 412 for extracting signals. A first end 412a of the transmission line 412 is conductive-connected to a first balanced external terminal electrode, and a second end 412b is conductive-connected to a first end 413a of a transmission line 413, to be described later, through a via conductor.

The upper surface of the fourth dielectric layer 404 has the transmission line 413 that constitutes the quarter-wave transmission line 13 of the Marchand balun 10. The transmission line 413 is in a spiral shape, whose first end 413a located at the center is connected to the second end 412b of the transmission line 412 through a via conductor. A second end 413b of the transmission line 413 located at the outer periphery is conductive-connected to the grounding electrode layer 411 through a via conductor.

The upper surface of the fifth dielectric layer 405 has a transmission line 414 that constitutes a half of the half-wave transmission line of the Marchand balun 10, that is, the quarter-wave transmission line 11. The transmission line 414 has substantially the same spiral shape as the transmission line 413, and is opposed to the transmission line 413 in such a manner as to agree therewith, with a dielectric substance sandwiched therebetween. A first end 414a of the transmission line 414 located at the outer periphery of the spiral is connected to an external terminal electrode on the upper surface of the dielectric layer 405. A second end 414b of the transmission line 414 at the center of the spiral is conductive-connected to a first end 415a of a transmission line 415, to be described later, through a via conductor.

The upper surface of the sixth dielectric layer 406 has the transmission line 415 that constitutes a half of the half-wave transmission line of the Marchand balun 10, that is, the quarter-wave transmission line 12. The transmission line 415 has substantially the same spiral shape as the transmission line 414, and is opposed to the transmission line 414 in such a manner as to agree therewith, with a dielectric substance therebetween. The first end 415a of the transmission line 415 located at the center of the spiral is conductive-connected to the second end 414b of the transmission line 414 through a via conductor. A second end 415b of the transmission line 415 located at the outer periphery of the spiral is open.

The upper surface of the seventh dielectric layer 407 has a transmission line 416 that constitutes the quarter-wave transmission line 14 of the Marchand balun 10. The transmission line 416 has substantially the same spiral shape as the transmission line 415, and is opposed to the transmission line 415 in such a manner as to agree therewith, with a dielectric substance therebetween. A first end 416a of the transmission line 416 located at the center of the spiral is connected to a second end 417b of a transmission line 417, to be described later, through a via conductor. A second end 416b of the transmission line 416 located at the outer periphery of the spiral is conductive-connected to a grounding electrode layer 418, to be described later, through a via conductor.

The upper surface of the eighth dielectric layer 408 has a transmission line 417 for extracting signals. A first end 417a of the transmission line 417 is conductive-connected to a second balanced external terminal electrode, and a second end 417b of the transmission line 417 is conductive-connected to the first end 416a of the transmission line 416 through a via conductor.

The upper surface of the ninth dielectric layer 409 except part of the periphery has the grounding electrode layer 418 which is conductive-connected to a grounding external terminal electrode at positions of the periphery.

Thus, the multilayer balun 400 constituting the Marchand balun 10 is formed. This multilayer balun 400 has the transmission line 414 serving as a half of the half-wave transmission line and the transmission line 415 serving as the other half of the half-wave transmission line which are disposed in adjacent layers, with a dielectric substance therebetween. The transmission lines 414 and 415 are disposed in layers and conductive-connected such that the currents of the transmission lines 414 and 415 flow in the same direction during use. Thus, the magnetic field generated around the transmission line 414 due to the current of the transmission line 414 and the magnetic field generated around the transmission line 415 due to the current of the transmission line 415 cancel each other in the gap between the transmission lines 414 and 415 to form magnetic shield between the transmission lines 414 and 415. This prevents unnecessary magnetic coupling between the transmission lines 414 and 415 which extremely deteriorates the characteristics of the balun, thus eliminating the need for the grounding electrode layer for preventing magnetic interference between the transmission lines 414 and 415, as in the conventional example.

Furthermore, the transmission lines 414 and 415 constituting a half-wave transmission line are disposed in layers with a dielectric substance therebetween so as to achieve capacitive coupling, as in the first embodiment. This produces a wavelength decreasing effect on the half-wave transmission line formed of the transmission lines 414 and 415, allowing the transmission lines 414 and 415 to be reduced in length.

Thus, the multilayer balun 400 can be decreased in size and height as compared with the conventional ones. The use of the multilayer balun 400 facilitates application to a compact multilayer balance filter that combines a filter and a balun, and facilitates manufacturing as compared with conventional ones because the grounding electrode of the intermediate layer in the conventional examples can be omitted.

A fourth embodiment of the invention will next be described.

In the fourth embodiment, a hybrid integrated circuit module equipped with the multilayer balun according to one of the first to third embodiments will be described. This embodiment has the multilayer balun in the multilayer substrate.

Figure 13:
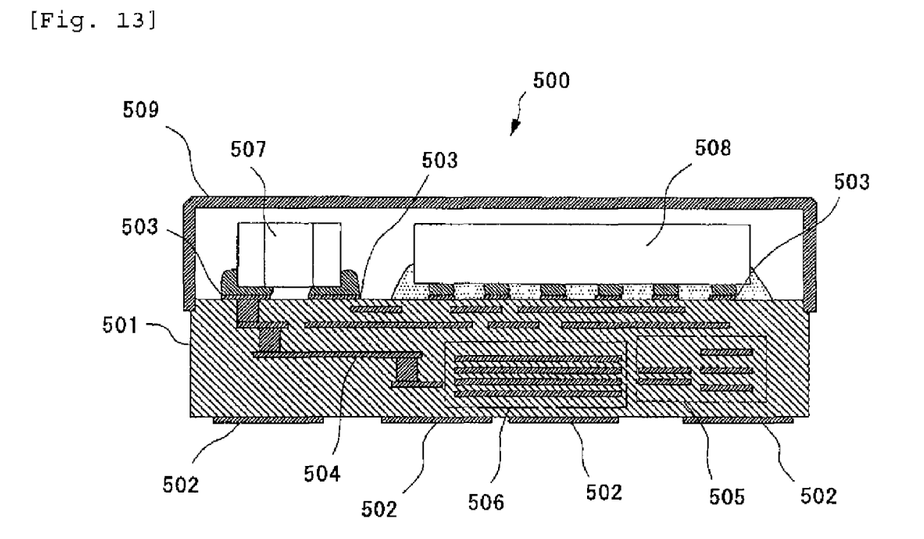
FIG. 13 is a sectional view of a hybrid integrated circuit module according to a fourth embodiment of the invention.
Figure 14:
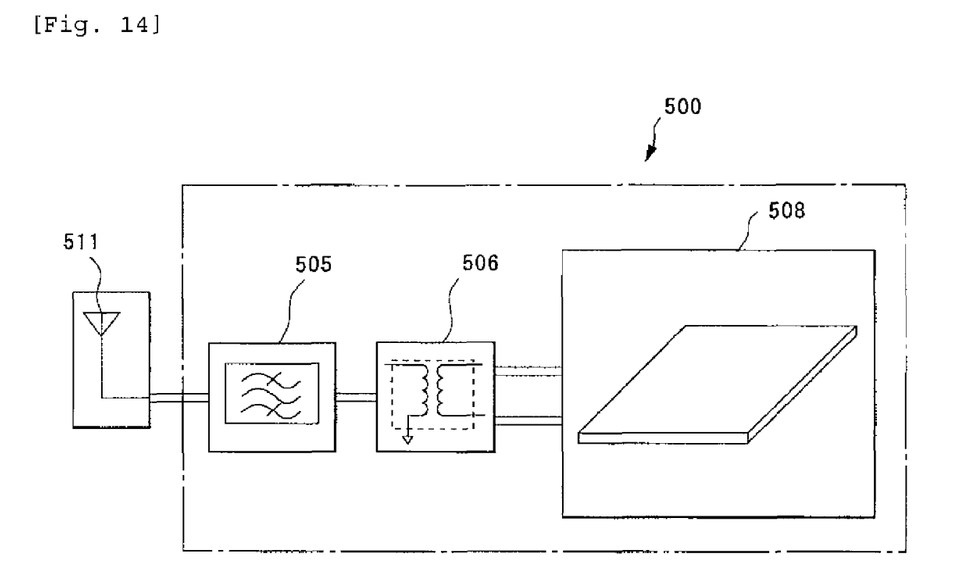
FIG. 14 is a block diagram of the electrical system of the hybrid integrated circuit module according to the fourth embodiment of the invention.

FIG. 13 is a sectional view of the hybrid integrated circuit module according to the fourth embodiment. FIG. 14 is a block diagram of the electrical system of the hybrid integrated circuit module of the fourth embodiment. In the drawings, the hybrid integrated circuit module 500 has a structure in which a band-pass filter 505, a multilayer balun transformer 506, a high-frequency sending and receiving IC and so on are formed on a multilayer substrate 501 made of low temperature co-fired ceramics. One input-output terminal of the band-pass filter 505 is connected to the high-frequency sending and receiving IC via the multilayer balun transformer 506. The other input-output terminal of the band-pass filter 505 is connected to an antenna 511 during use.

The bottom of the multilayer substrate 501 has a plurality of external terminal electrodes 502 for connection, and the upper surface of the multilayer substrate 501 has electronic parts 507, such as a resistor and a capacitor, and a high-frequency sending and receiving IC 508. The electronic parts 507 and the high-frequency sending and receiving IC 508 are conductive-connected to the multilayer balun transformer 506 formed in the multilayer substrate 501 via land electrodes 503 formed on the upper surface of the multilayer substrate 501 and multilayer cables 504 formed in the multilayer substrate 501. The multilayer balun transformer 506 is connected to the band-pass filter 505 formed in the multilayer substrate 501. The antenna connecting input-output terminal of the band-pass filter 505 is connected to a predetermined land electrode 503. The upper surface of the multilayer substrate 501 has a shield cover 509 to cover the electronic parts 507, the high-frequency sending and receiving IC 508, and so on.

Since the multilayer balun 506 of the hybrid integrated circuit module 500 with the above structure is the multilayer balun transformer according to any one of the first to third embodiments, the multilayer balun transformer 506 can be reduced in size and height, so that the multilayer balun transformer 506 can easily be mounted in the multilayer substrate 501.

While the multilayer substrate 501 of the fourth embodiment is made of low temperature co-fired ceramics, the invention is not limited to that. The multilayer substrate may be made of resin, such as epoxy resin and polyimide resin, or may be made of resin mixed with glass fibers. While the multilayer balun transformer 506 of the fourth embodiment is disposed in the multilayer substrate 501, a hybrid integrated circuit module may be formed in which the multilayer balun element is mounted on a multilayer substrate.

As an alternative, the multilayer balun according to any of the first to third embodiment may be embedded in a multilayer substrate for use other than a hybrid integrated circuit module.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A multilayer balun having a half-wave transmission line, a quarter-wave transmission line opposed to a first half of the half-wave transmission line, with a dielectric substance therebetween, and a quarter-wave transmission line opposed to a second half of the half-wave transmission line, with a dielectric substance therebetween, the multilayer balun comprising:
   a first dielectric layer having a first transmission line that constitutes the first half of the half-wave transmission line;
   a second dielectric layer stacked next to the first dielectric layer and having a second transmission line that constitutes the second half of the half-wave transmission line, with a dielectric substance therebetween so that, during use, the current flows in the same direction as that of the first transmission line;
   a conductive connection between the first transmission line and the second transmission line, with the dielectric substance therebetween, so that their currents flow in the same direction;
   a third dielectric layer stacked next to the first dielectric layer and having a third transmission line constituting a first quarter-wave transmission line in such a manner as to electromagnetically couple with the first transmission line, with a dielectric substance therebetween;
   a fourth dielectric layer stacked next to the second dielectric layer and having a fourth transmission line constituting a second quarter-wave transmission line in such a manner as to electromagnetically couple with the second transmission line, with a dielectric substance therebetween;
   a first grounding electrode layer stacked next to the third dielectric layer, with a dielectric substance therebetween; and
   a second grounding electrode layer stacked next to the fourth dielectric layer, with a dielectric substance therebetween.

2. The multilayer balun according to claim 1, wherein each of the first to fourth transmission lines is in a spiral shape.

3. The multilayer balun according to claim 1, wherein each of the first to fourth transmission lines is partly in a meandering shape.

4. A multilayer substrate comprising the multilayer balun according to claim 1.

5. The multilayer substrate according to claim 4, wherein the multilayer substrate is a low temperature co-fired ceramics substrate.

6. A multilayer balun having a half-wave transmission line, a quarter-wave transmission line opposed to a first half of the half-wave transmission line, with a dielectric substance therebetween, and a quarter-wave transmission line opposed to a second half of the half-wave transmission line, with a dielectric substance therebetween, the multilayer balun comprising:
   a first dielectric layer having a first transmission line that constitutes the first half of the half-wave transmission line;
   a second dielectric layer stacked next to the first dielectric layer and having a second transmission line that constitutes the second half of the half-wave transmission line, with a dielectric substance therebetween, so as to achieve capacitive coupling, and wherein the first transmission line and the second transmission line have a conductive connection so that the currents in the first and second transmission lines flow in the same direction;
   a third dielectric layer stacked next to the first dielectric layer and having a third transmission line that constitutes a first quarter-wave transmission line, with a dielectric substance therebetween, so as to achieve magnetic coupling;

a fourth dielectric layer stacked next to the second dielectric layer and having a fourth transmission line constituting a second quarter-wave transmission line in such a manner as to electromagnetically couple with the second transmission line, with a dielectric substance therebetween;

a first grounding electrode layer stacked next to the third dielectric layer, with a dielectric substance therebetween; and a second grounding electrode layer stacked next to the fourth dielectric layer, with a dielectric substance therebetween.

7. The multilayer balun according to claim 6, wherein each of the first to fourth transmission lines is partly in a meandering shape.

8. A hybrid integrated circuit module comprising the multilayer balun according to claim 6.

9. The hybrid integrated circuit module according to claim 8, comprising a multilayer ceramic substrate in which the multilayer balun is disposed.

10. The hybrid integrated circuit module according to claim 9, wherein the multilayer ceramic substrate is made of low temperature co-fired ceramics.

11. The multilayer balun according to claim 6, wherein each of the first to fourth transmission lines is in a spiral shape.

12. A multilayer balun comprising:

a half-wave transmission line comprising:

a first dielectric layer having a first transmission line that constitutes a first half of the half-wave transmission line; and a second dielectric layer stacked next to the first dielectric layer and having a second transmission line that constitutes the second half of the half-wave transmission line and is opposed to the first transmission line, with a dielectric substance therebetween, wherein the first transmission line and the second transmission line are connected such that their currents flow in the same direction, a first quarter-wave transmission line opposed to the first transmission line, with a dielectric substance therebetween;

a second quarter-wave transmission line opposed to the second transmission line, with a dielectric substance therebetween;

a first ground plane opposed to the first quarter-wave transmission line; and a second ground plane opposed to the second quarter-wave transmission line.

* * * * *